(12) United States Patent
Okada

(10) Patent No.: US 9,070,959 B2
(45) Date of Patent: Jun. 30, 2015

(54) CONNECTION UNIT

(75) Inventor: Norio Okada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 271 days.

(21) Appl. No.: 13/571,961

(22) Filed: Aug. 10, 2012

(65) Prior Publication Data
US 2013/0161076 A1 Jun. 27, 2013

(30) Foreign Application Priority Data

Dec. 22, 2011 (JP) ................................. 2011-281748

(51) Int. Cl.
*H05K 1/00* (2006.01)
*H01P 5/02* (2006.01)
*H01R 13/6474* (2011.01)
*H01R 12/62* (2011.01)
*H05K 3/36* (2006.01)
*H05K 1/02* (2006.01)
*H05K 1/03* (2006.01)

(52) U.S. Cl.
CPC ............ *H01P 5/028* (2013.01); *H01R 13/6474* (2013.01); *H01R 12/62* (2013.01); *H05K 1/0218* (2013.01); *H05K 1/0219* (2013.01); *H05K 1/025* (2013.01); *H05K 1/0306* (2013.01); *H05K 3/361* (2013.01); *H05K 3/366* (2013.01); *H05K 2201/0715* (2013.01); *H05K 2201/1034* (2013.01)

(58) Field of Classification Search
CPC .... H01P 5/028; H01R 12/62; H01R 13/6474; H05K 1/025; H05K 1/0219; H05K 1/0306; H05K 1/0218; H05K 3/361; H05K 3/366; H05K 2201/0715; H05K 2201/1034
USPC .......................................... 174/258, 254, 255
See application file for complete search history.

(56) References Cited

U.S. PATENT DOCUMENTS

| 5,459,500 | A | * | 10/1995 | Morris et al. | .................... 347/50 |
| 2003/0104715 | A1 | * | 6/2003 | Tsai et al. | ........................ 439/95 |
| 2007/0126524 | A1 | * | 6/2007 | Yagisawa | ......................... 333/33 |
| 2011/0008056 | A1 | * | 1/2011 | Yagisawa | ...................... 398/182 |

FOREIGN PATENT DOCUMENTS

| CN | 101971414 A | 2/2011 |
| JP | 2009-4460 A | 1/2009 |
| JP | 2010-200234 A | 9/2010 |

OTHER PUBLICATIONS

State Intellectual Property Office of the People's Republic of China, International Search Report in Chinese Patent Application No. 201210559942.4 (Nov. 3, 2014).

* cited by examiner

*Primary Examiner* — Chau N Nguyen
*Assistant Examiner* — Paul McGee, III
(74) *Attorney, Agent, or Firm* — Leydig, Voit & Mayer, LTD.

(57) ABSTRACT

A connection unit includes: a ceramic substrate; a first signal line on the ceramic substrate; a first grounded conductor on the ceramic substrate and electromagnetically coupled to the first signal line; a first lead pin having a first end connected to an upper surface of the first signal line and a second end protruding beyond the ceramic substrate; a second lead pin having a first end connected to an upper surface of the first grounded conductor and a second end protruding beyond the ceramic substrate; a flexible substrate including an insulating layer through which the first and second lead pins penetrate, a second signal line on a first major surface of the insulating layer and connected to the second end of the first lead pin, and a second grounded conductor on a second major surface of the insulating layer and connected to the second end of the second lead pin.

1 Claim, 7 Drawing Sheets

CONNECTION UNIT

BACKGROUND OF THE INVENTION

1. Field of the Invention

The present invention relates to a connection unit in which a flexible printed circuit is connected to a ceramic substrate, and in particular to a connection unit that can make assembly easier and prevent the deterioration of high-frequency characteristics.

2. Background Art

In recent years, a connection unit in which a flexible printed circuit is connected to a ceramic substrate has been used. In a conventional connection unit, in order to lower signal loss at a high frequency of 20 GHz or more, a flexible printed circuit has been directly fixed to the field-through portion of a ceramic substrate (for example, refer to Japanese Patent Application Laid-Open No. 2010-200234).

SUMMARY OF THE INVENTION

In conventional connection units, since mounting positions are easily misaligned, and short-circuiting with other pins or poor connection occurs, they were hard to assemble.

In view of the above-described problems, an object of the present invention is to provide a connection unit that can make assembly easier and prevent the deterioration of high-frequency characteristics.

According to the present invention, a connection unit includes: a ceramic substrate; a first signal line on the ceramic substrate; a first grounded conductor on the ceramic substrate and field-joined with the first signal line; a first lead pin having a first end connected to an upper surface of the first signal line and a second end protruding to a side of the ceramic substrate; a second lead pin having a first end connected to an upper surface of the first grounded conductor and a second end protruding to a side of the ceramic substrate; a flexible substrate including an insulating layer through which the first and second lead pins penetrate and which has first and second major surfaces facing one another, a second signal line on the first major surface of the insulating layer and connected to the second end of the first lead pin, and a second grounded conductor on the second major surface of the insulating layer and connected to the second end of the second lead pin; and a metal block having a bottom surface connected to the upper surface of the first grounded conductor at a place between the first lead pin and the second lead pin, and a side surface connected to the second grounded conductor.

The present invention makes it possible to make assembly easier and prevent the deterioration of high-frequency characteristics.

Other and further objects, features and advantages of the invention will appear more fully from the following description.

DETAILED DESCRIPTION OF THE PREFERRED EMBODIMENTS

A connection unit according to the embodiments of the present invention will be described with reference to the drawings. The same components will be denoted by the same symbols, and the repeated description thereof may be omitted.

First Embodiment

Figure 1:
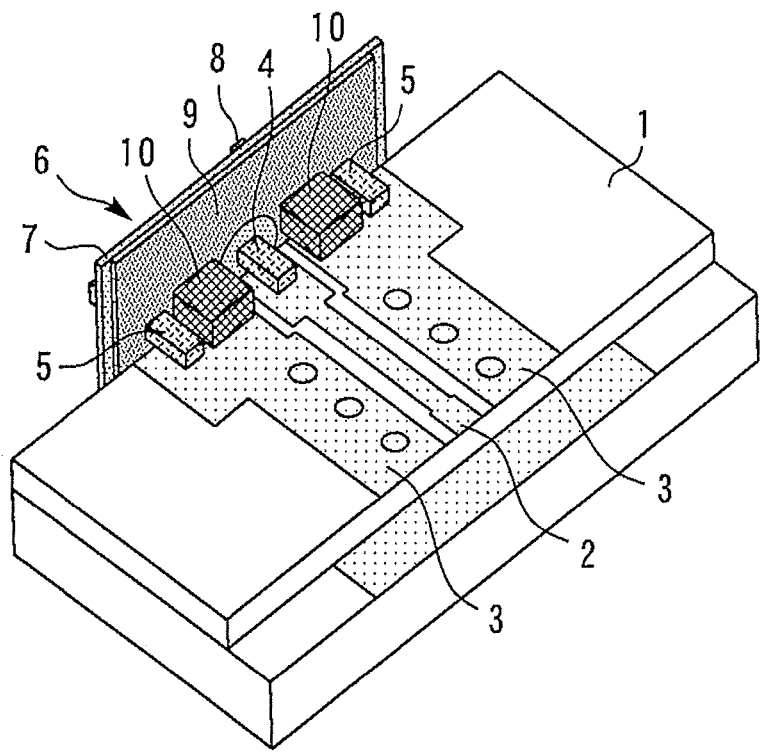
FIGS. 1 and 2 are perspective views showing a connection unit according to a first embodiment of the present invention.
Figure 2:
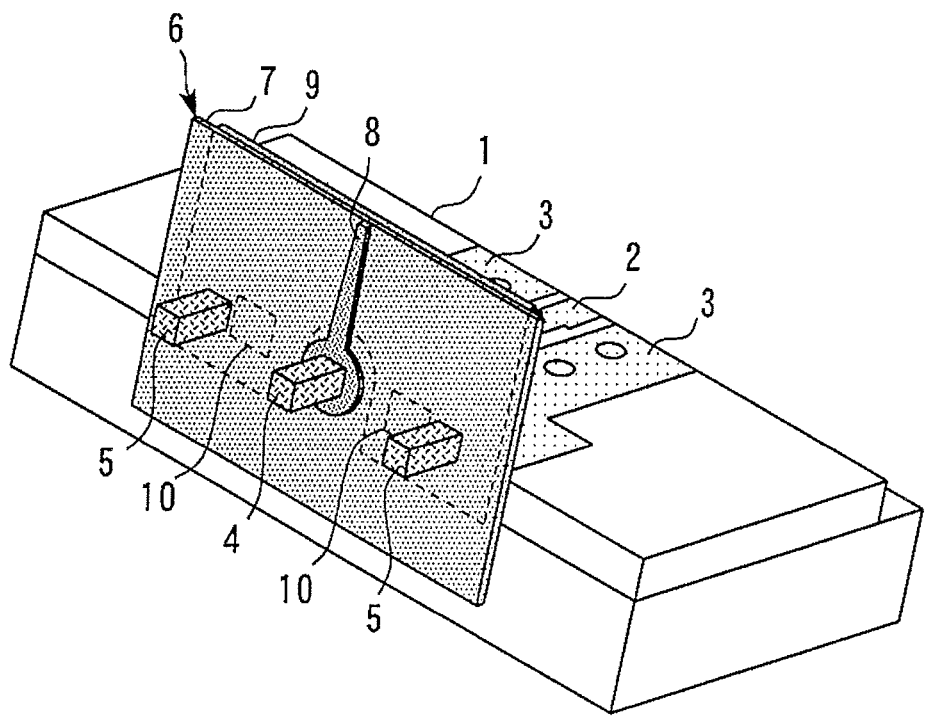
Figure 3:
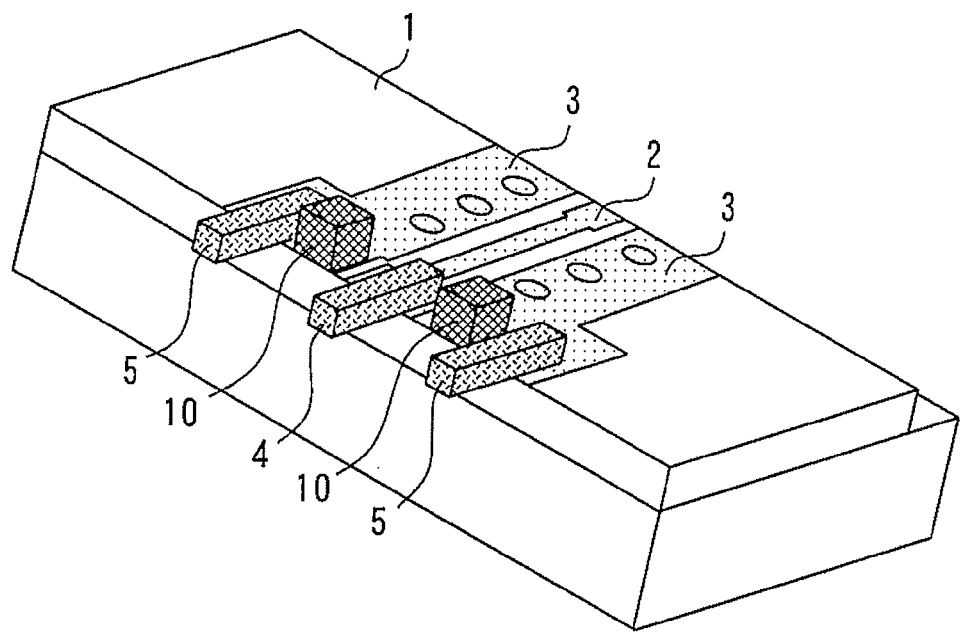
FIG. 3 is a perspective view showing a state before a flexible printed circuit of the device in FIG. 2 is assembled.

FIGS. 1 and 2 are perspective views showing a connection unit according to a first embodiment of the present invention. FIG. 3 is a perspective view showing a state before a flexible printed circuit of the device in FIG. 2 is assembled.

A signal line 2 and grounded conductors 3 are provided on a ceramic substrate 1. The grounded conductors 3 are field-joined to constitute a coplanar line. One end of a lead pin 4 is connected to an upper surface of the signal line 2, and ends of lead pins 5 are connected to upper surfaces of the grounded conductors 3. The other ends of the lead pins 4 and 5 protrude to a side of the ceramic substrate 1.

A flexible printed circuit 6 is connected to a side surface of the ceramic substrate 1. Lead pins 4 and 5 penetrate through an insulating layer 7 of the flexible printed circuit 6, and assist the connection of the flexible printed circuit 6 and the ceramic substrate 1.

The insulating layer 7 includes first and second major surfaces facing one another. A signal line 8 is provided on the first major surface of the insulating layer 7, and a grounded conductor 9 is provided on the second major surface of the insulating layer 7. The signal line 8 and the grounded conductor 9 on top and back surfaces of the insulating layer 7 are field joined to constitute a micro strip line. The other end of the lead pin 4 is connected to the signal line 8, and the other end of the lead pin 5 is connected to the grounded conductor 9.

In the present embodiment, a bottom surface of a metal block 10 is connected to the upper surface of the grounded conductor 3 at a place between the lead pin 4 and the lead pin 5. A side surface of the metal block 10 is connected to the grounded conductor 9.

Here, because of the limitation of fabrication, a pitch between the lead pins 4 and 5 cannot be narrow. Therefore, a connecting distance from the grounded conductor 3 on the ceramic substrate 1 to the grounded conductor 9 on the flexible printed circuit 6 lengthens, the field connection becomes weakened, and impedance mismatching becomes readily occur.

In the present embodiment, therefore, metal blocks 10 are provided between the lead pin 4 and the lead pin 5. Thereby, the grounded conductor 9 on the flexible printed circuit 6 is connected to the metal blocks 10 before connecting to the lead pins 5. Therefore, the connecting distance from the grounded conductors 3 to the grounded conductor 9 is shortened, and the mismatch of impedance can be restricted. As a result, the deterioration of high-frequency characteristics can be prevented.

Figure 4:
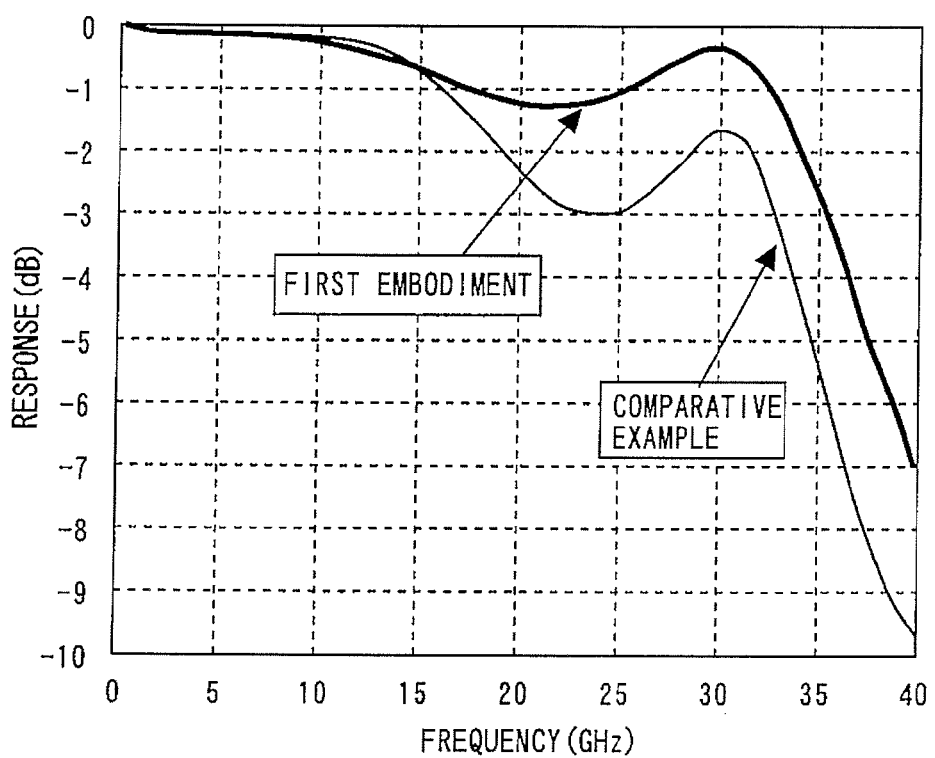
FIG. 4 is a graph showing the frequency response characteristics of the first embodiment and a comparative example.

FIG. 4 is a graph showing the frequency response characteristics of the first embodiment and a comparative example. The comparative example is an example when there are no metal blocks 10. It can be seen that the frequency response characteristics, especially at 20 GHz or higher, of the first embodiment can be improved compared with the comparative example.

In addition, in the present embodiment, since the lead pins 4 and 5 penetrate through the insulating layer 7 of the flexible printed circuit 6, since the mounting position is difficult to misalign, short circuit or disconnection to other pins occurs, assembling is easy. Furthermore, since the flexible printed circuit 6 can be fixed by the lead pins 4 and 5, the mechanical strength and the location accuracy can be maintained.

Second Embodiment

Figure 5:
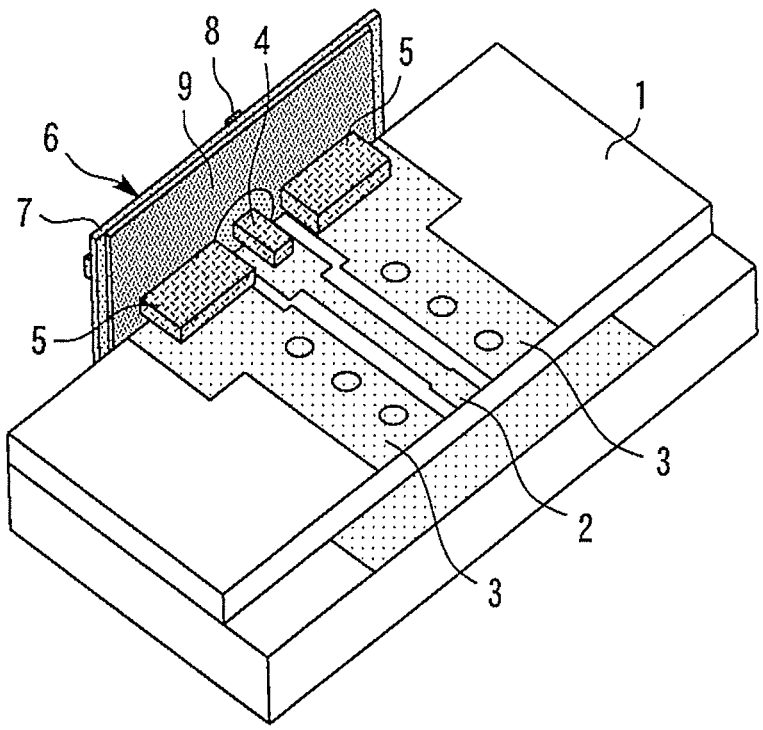
FIGS. 5 and 6 are perspective views showing a connection unit according to a second embodiment of the present invention.
Figure 6:
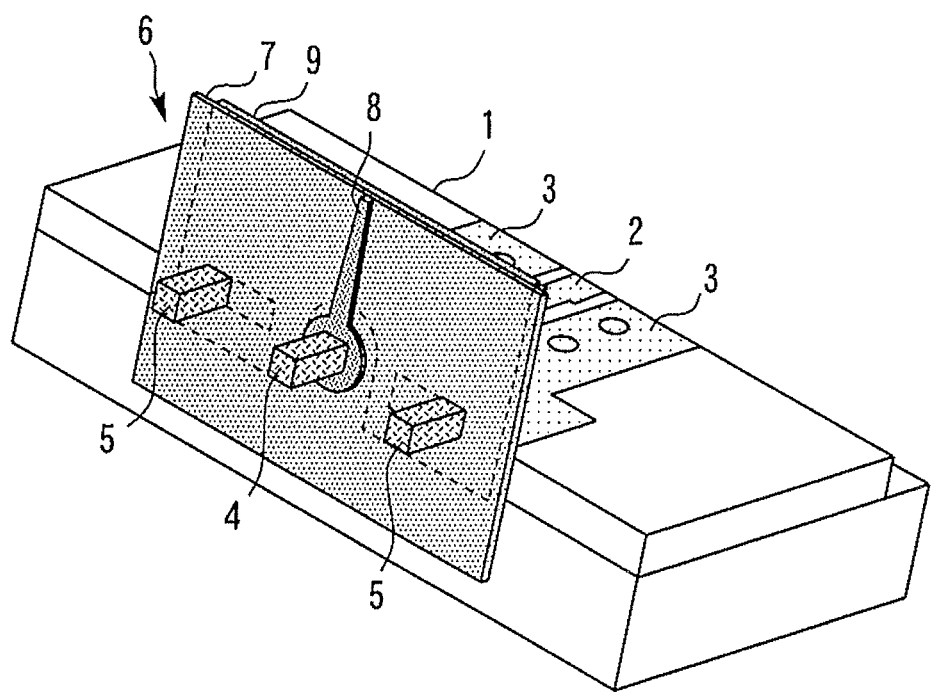
Figure 7:
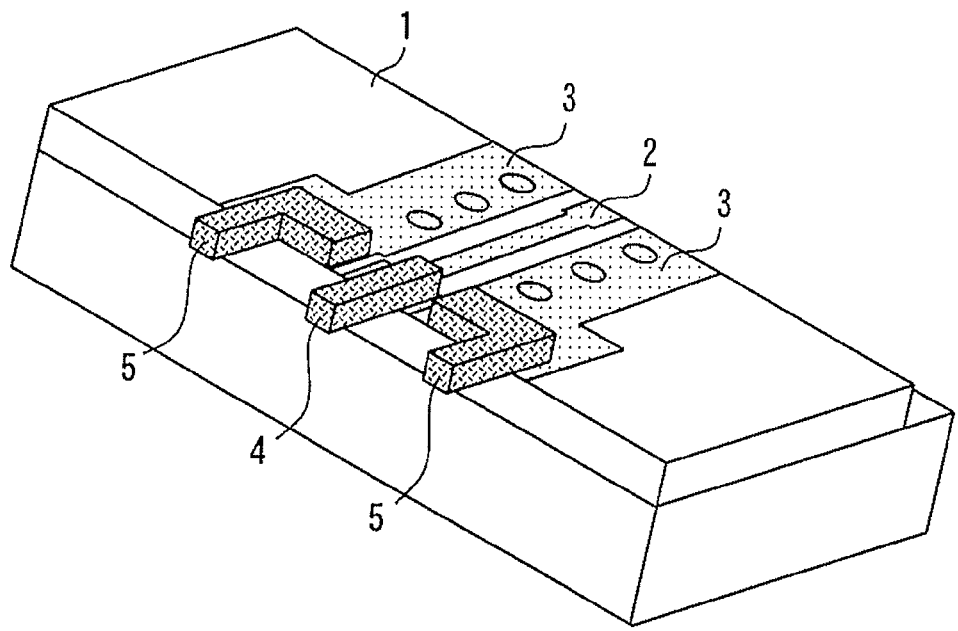
FIG. 7 is a perspective view showing the state before the flexible printed circuit is installed in the device shown in FIG. 6.

FIGS. 5 and 6 are perspective views showing a connection unit according to a second embodiment of the present invention. FIG. 7 is a perspective view showing the state before the flexible printed circuit is installed in the device shown in FIG. 6.

A lead pin 5 in the present embodiment has a shape wherein the connecting portions to the grounded conductor 3 are extended toward a signal line 2. The side surface of the extended portion is connected to a grounded conductor 9. More specifically, the lead pins 5 in the present embodiment is the combination of the lead pins 5 and the metal block 10 in the first embodiment. Thereby, since the connecting distance from the grounded conductors 3 to the grounded conductor 9 is shortened, effects similar to the effects in the first embodiment can be obtained.

Third Embodiment

Figure 8:
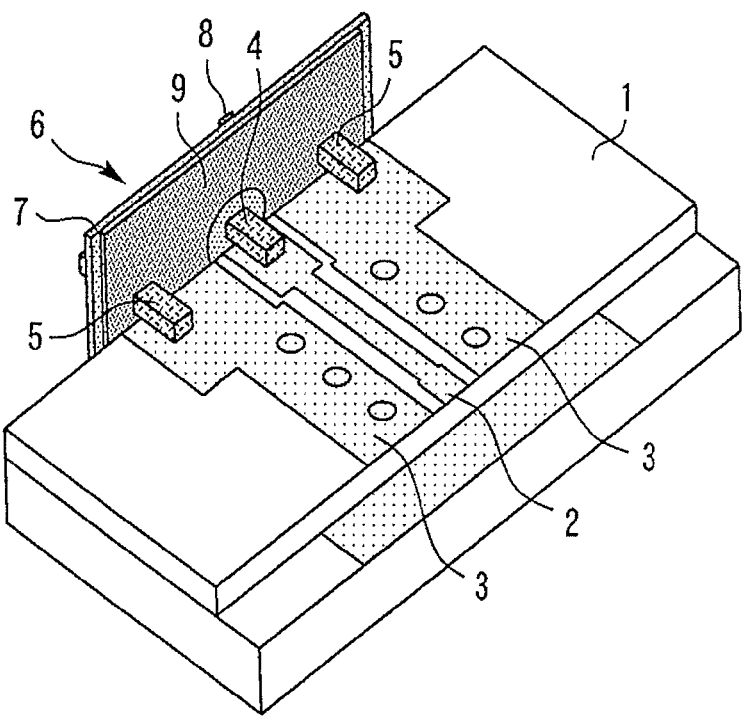
FIGS. 8 and 9 are perspective views showing a connection unit according to a third embodiment of the present invention.
Figure 9:
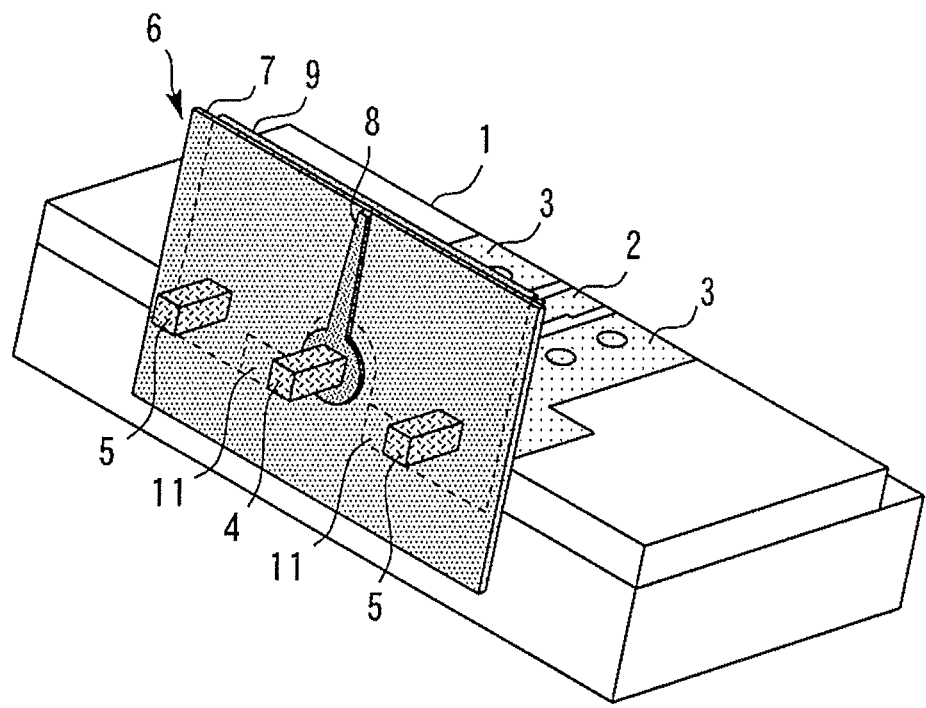
Figure 10:
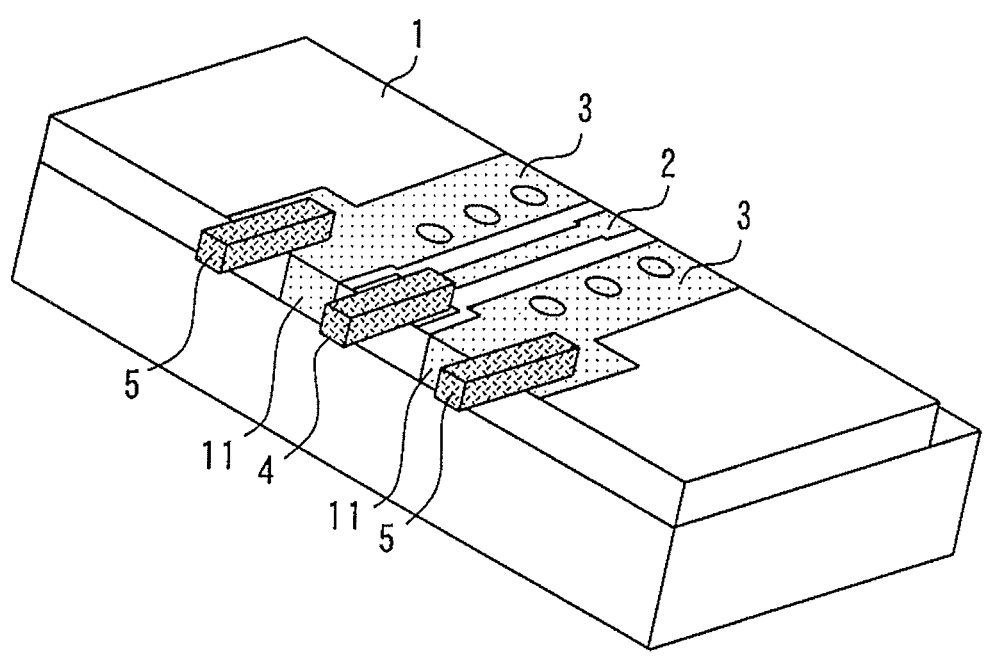
FIG. 10 is a perspective view showing the state before the flexible printed circuit is installed in the device shown in FIG. 9.

FIGS. 8 and 9 are perspective views showing a connection unit according to a third embodiment of the present invention. FIG. 10 is a perspective view showing the state before the flexible printed circuit is installed in the device shown in FIG. 9.

In place of the metal block 10 in the first embodiment, grounded conductors 11 are provided on the side surface of the ceramic substrate 1 in the place between the lead pin 4 and the lead pin 5. The grounded conductors 11 are connected to the grounded conductors 3, and connected facing to the grounded conductor 9. Thereby, since the connecting distance from the grounded conductors 3 to the grounded conductor 9 is shortened, effects similar to the effects in the first embodiment can be obtained.

Fourth Embodiment

Figure 11:
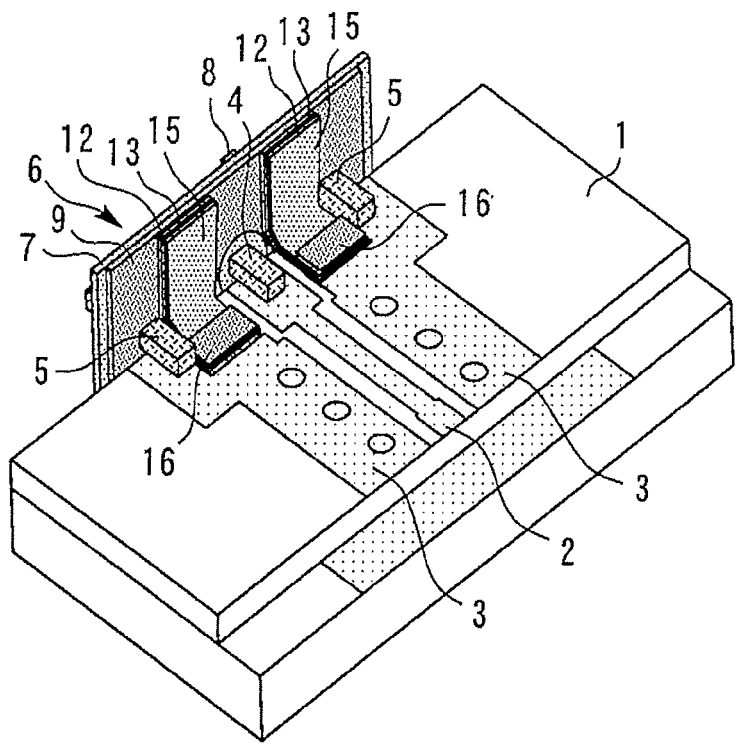
FIGS. 11 and 12 are perspective views showing connection units according to a fourth embodiment of the present invention.
Figure 12:
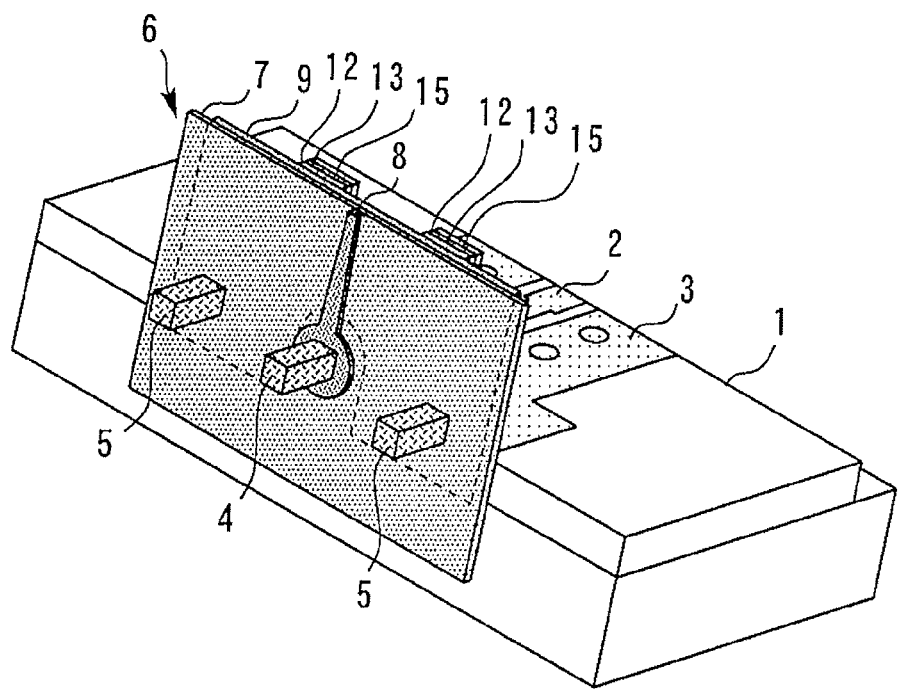
Figure 13:
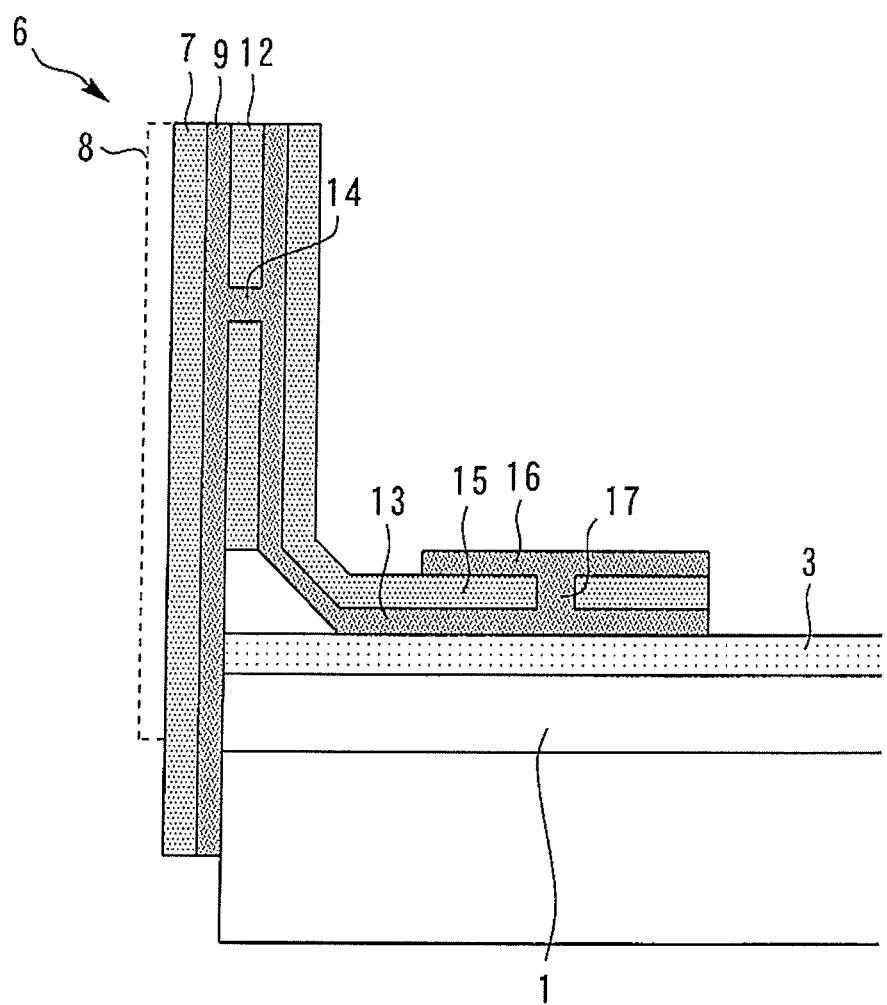
FIG. 13 is a sectional view showing a part of the connection unit according to the fourth embodiment of the present invention.

FIGS. 11 and 12 are perspective views showing connection units according to a fourth embodiment of the present invention. FIG. 13 is a sectional view showing a part of the connection unit according to the fourth embodiment of the present invention.

In place of the metal blocks 10 in the first embodiment, a flexible printed circuit 6 of four-layer constitution is used. A signal line 8 is provided on the first major surface of the insulating layer 7 as the first layer, and a grounded conductor 9 is provided on the second major surface of the insulating layer 7 as the second layer. The signal line 8 and the grounded conductor 9 on the top and back surfaces of the insulating layer 7, respectively, are mainly field-bonded to constitute a micro-strip line. The other end of the lead pin 4 is connected to the signal line 8, and the other ends of the lead pins 5 are connected to the grounded conductor 9. Moreover, not only the signal line 8, a grounded conductor may be provided on the first layer.

An insulating layer 12 is provided on the grounded conductor 9, and a grounded conductor 13 is provided thereon as a third layer. The grounded conductor 13 is connected to the grounded conductor 9 along a via 14 passing through the insulating layer 12. An insulating layer 15 is provided on the grounded conductor 13, and the grounded conductor 16 is provided thereon as a fourth layer. The grounded conductor 16 is connected to the grounded conductor 13 along a via 17 passing through the insulating layer 15.

The grounded conductor 13 and the insulating layer 15 are bent by 90 degrees, and are placed on the ceramic substrate 1. Then, the grounded conductor 13 is connected to the grounded conductor 3 at the place between the lead pin 4 and the lead pin 5. Since the connection distance from the grounded conductor 3 to the grounded conductor 9 is shortened, thereby, effects similar to the effects of the first embodiment can be obtained. Furthermore, since metal parts such as the metal block 10 are not required, the connection units can be fabricated at a moderate price.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-281748, filed on Dec. 22, 2011, including specification, claims, drawings, and summary, on which the Convention priority of the present application is based, is incorporated herein by reference in its entirety.

What is claimed is:
1. A connection unit comprising:
a ceramic substrate having a top surface and a first side surface that is transverse to the top surface;
a first signal line on the top surface of the ceramic substrate;
a first grounded conductor on the top surface of the ceramic substrate that is electrically insulated from and electromagnetically coupled to the first signal line;
a first lead pin having a first end connected to an upper surface of the first signal line and a second end protruding beyond the first side surface of the ceramic substrate;
a second lead pin having a first end connected to an upper surface of the first grounded conductor and a second end protruding beyond the first side surface of the ceramic substrate;
a flexible substrate including
a first insulating layer having first and second major surfaces that are opposite each other,
a second grounded conductor on the second major surface of the insulating layer,
a second signal line on the first major surface of the first insulating layer of the flexible substrate, wherein
the flexible substrate is mounted on the first side surface of the ceramic substrate with the second grounded conductor in contact with the first side surface of the ceramic substrate,
the first and second lead pins penetrate through the flexible substrate, the second signal line is connected to the second end of the first lead pin, and
the second grounded conductor is connected to the second end of the second lead pin;
a second insulating layer on the second grounded conductor;
a third grounded conductor on the second insulating layer opposite the first insulating layer, including a bend, and extending onto and connected to the first grounded conductor, wherein the second insulating layer includes a first via through which the second grounded conductor and the third grounded conductor are connected to each other;
a third insulating layer on the third grounded conductor opposite the first insulating layer, including a bend, and extending onto the third grounded conductor opposite the first grounded conductor; and
a fourth grounded conductor on the third insulating layer opposite the third grounded conductor, wherein
the third insulating layer includes a second via through which the third grounded conductor and the fourth grounded conductor are connected to each other, and
the second via is located opposite the first grounded conductor, between the first lead pin and the second lead pin, and spaced from the first lead pin.

* * * * *